United States Patent [19]

Zambrano et al.

[11] Patent Number: 5,317,182
[45] Date of Patent: May 31, 1994

[54] TERMINATION OF THE POWER STAGE OF A MONOLITHIC SEMICONDUCTOR DEVICE

[75] Inventors: Raffaele Zambrano, La Punta CT; Antonio Grimaldi, Scicli RG, both of Italy

[73] Assignee: Consorzio Per la Ricerca Sulla Microelettronica, Catania, Italy

[21] Appl. No.: 706,751

[22] Filed: May 29, 1991

[30] Foreign Application Priority Data

May 31, 1990 [IT] Italy .................................. 6610A/90

[51] Int. Cl.$^5$ ...................... H01L 29/70; H01L 29/78
[52] U.S. Cl. ................................ 257/378; 257/328; 257/329; 257/334; 257/337; 257/487; 257/494; 257/500; 257/502
[58] Field of Search ............... 257/146, 328, 329, 334, 257/337, 378, 487, 494, 500, 502

[56] References Cited

U.S. PATENT DOCUMENTS 4,345,265  8/1982  Blanchard ........................... 257/339
4,589,004  5/1986  Yasuda et al. ...................... 257/378

FOREIGN PATENT DOCUMENTS 0037764  3/1981  European Pat. Off. .
0282734  9/1988  European Pat. Off. .
0361319  9/1989  European Pat. Off. .

OTHER PUBLICATIONS

Blicher, "Physics of Semiconductor Power Devices", Rep. Prog. Phys., vol. 45, pp. 446-450 (1982).
Microelectronics Journal vol. 20, No. 1-2, pp. 77-103 (1989) Rossel et al., "Smart Power and High Voltage Integrated Circuits and Related MOS Technologies".
Patent Abstracts of Japan vol. 7, No. 204 (E-197)(1349) Sep. 9, 1983 (JP-A-58-100-460).
Patent Abstracts of Japan vol. 12, No. 449 (E-686)(3296) Jul. 21, 1988 (JP-A-63-177-566).
Baliga, Modern Power Devices, pp. 263-274 (1987).

Primary Examiner—Jerome Jackson

[57] ABSTRACT

A smart power integrated circuit, in which the power stage includes a vertical-current-flow NMOS power transistor having many paralleled cells. A deeper P-type diffusion surrounds the P-type body region of the cells at the edge of the power stage. The junction between this deep P-type diffusion and the laterally adjacent N-type material has a lower curvature than the junction which would be formed by the P-type body region alone. This increases the transistor's breakdown voltage without degrading the transistor's on-state resistance $R_{on}$.

32 Claims, 2 Drawing Sheets

TERMINATION OF THE POWER STAGE OF A MONOLITHIC SEMICONDUCTOR DEVICE

FIELD OF THE INVENTION

The present invention relates to the termination of the power stage of a monolithic semiconductor device, including an integrated control circuit and one or more vertical current flow MOS power transistors integrated in the same chip.

BACKGROUND OF THE INVENTION

Association in the same chip of vertical current flow MOS power transistors and an integrated control circuit provides a very compact and efficient device which is advantageous compared with separate components.

A recurring problem in providing such a device is maximization of the breakdown voltage, which is a decreasing function of the dopant concentration in the power stage drain region and an increasing function of the curvature radius of the body/drain junction thereof. At present the problem is solved by appropriate terminations of the junction, such as dielectric and/or metallic field plates, floating rings, low dopant concentration regions, etc. A review of these techniques can be found in "Physics of semiconductor devices" by A. Blicher, Rep. Prog. Phys., Vol. 45, 1982, pages 446-450.

The limits of these solutions are essentially that a) the termination region extends for distances even greater than 100 microns and this involves considerable waste of area, b) other manufacturing steps are added to the process and the cost of the device is thus increased, and c) the surface electric field is equal to, if not greater than, the electric field at the junction and, consequently, the reliability of the structure is poor (the process of passivation and/or encapsulation of the device can further reduce breakdown voltage).

OBJECTS OF THE INVENTION

The termination of the power stage in accordance with the present invention overcomes the above shortcomings and in particular maximizes the breakdown voltage without compromising the $R_{on}$ series resistance of the power stage and the reliability of the device.

SUMMARY OF THE INVENTION

For this purpose it provides a buried drain region underneath the body region and is characterized in that:
 the body region joins along its contour with a peripheral insulation region of the same type of conductivity but with a deeper junction, and
 the minimum distance of the body junction from the buried drain region is less than or equal to the minimum distance of the latter from the junction of said peripheral insulation region.

The essential characteristics of the associated manufacturing process are described in the claims set forth below.

BRIEF DESCRIPTION OF THE DRAWINGS

The invention will be further clarified by the description given below and the annexed drawings of an example of the known art and nonlimiting examples of embodiments of the invention in which.

SPECIFIC DESCRIPTION

Figure 1:
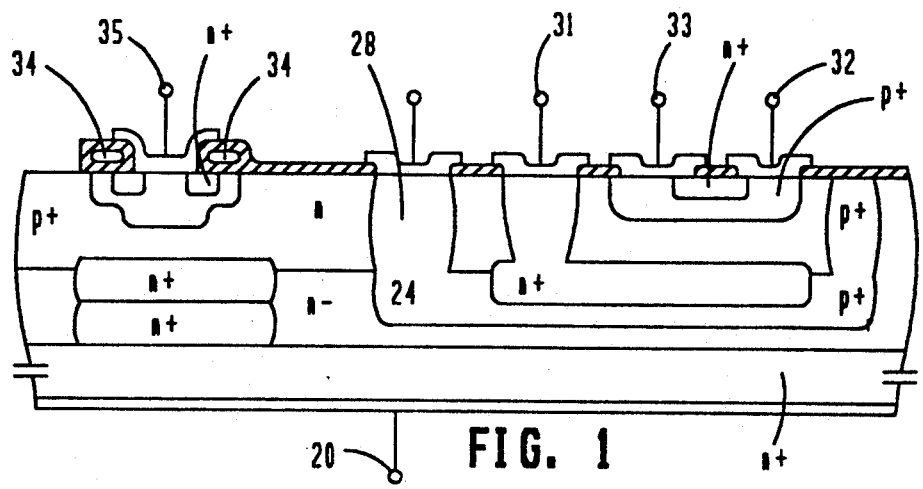
FIG. 1 shows an example of the structure of a semiconductor device in accordance with the known art.

FIG. 1 shows a possible structure of a known semiconductor device including a control circuit and one or more vertical current flow MOS transistors integrated in a monolithic manner in the same chip. For the sake of simplicity a single component of the integrated control circuit (a low voltage npn transistor) and a single MOS power transistor are shown.

In FIG. 1 the meanings of the various parts are as follows:
20,35: drain and source electrodes of the MOS transistor;
34: gate polycrystalline silicon;
24,28: isolation regions;
31,32,33: collector, base and emitter of the control circuit transistor.

In the device of FIG. 1 the breakdown voltage is limited by the minimum values which the curvature radius of the body/drain junction takes on along the periphery thereof, values which are typically on the order of 3-4 microns.

Figure 5:
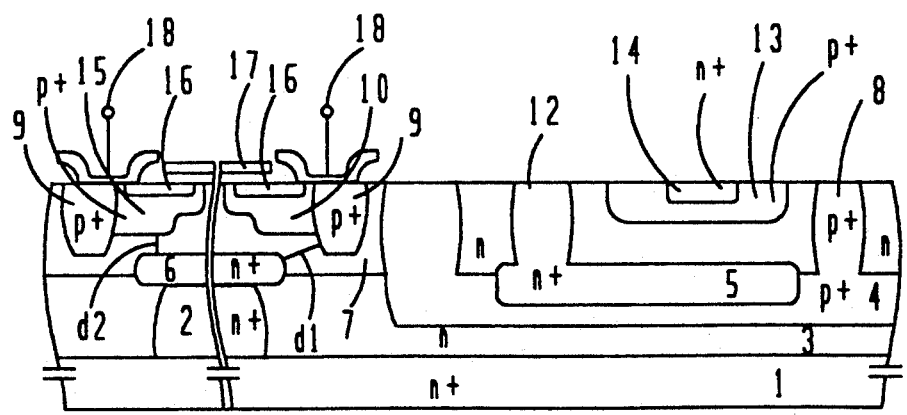
FIG. 5 shows the semiconductor device resulting from the process of FIGS. 2-4, and FIGS. 6-7 show structures of other examples of embodiments of the power stage in accordance with the invention.

An example of a possible embodiment of a power stage termination in accordance with the present invention is illustrated in FIG. 5. This figure shows that the body region, 15 of the power stage is made continuous with a diffused isolation region 9 with the same type of conductivity but with deeper junction and hence greater curvature radius Xj than the body junction would have at the edges without the region 9.

The increase in breakdown voltage which results is particularly significant (increasing by a factor greater than or equal to 2 if we go for example from Xj=3 microns to Xj=12 microns).

The same Figure shows that the minimum distance d1 between the buried drain region 6 and the region 9 is not less than the minimum distance d2 of the buried region 6 from the overlying junction 10 between body and drain.

This condition must be respected if it is desired that the breakdown voltage be determined by d2 and not by d1. There is now described with reference to FIGS. 2, 3 and 4 an example of a manufacturing process for the structure of FIG. 5.

Figure 2:
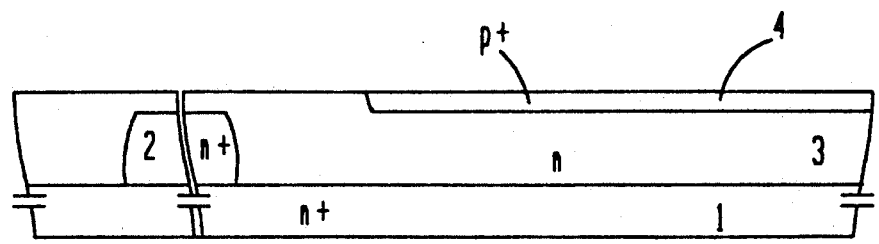
FIGS. 2-4 show steps of a process in accordance with the invention.

On a substrate 1 of n+ type monocrystalline silicon is implanted opposite the region 2 of FIG. 2 high diffusivity coefficient dopant with the same type of conductivity as the substrate. Then follow epitaxial growth of the n type layer 3 and formation, by diffusion of the dopant previously implanted, of n+ type region 2 designed to constitute a first buried drain region with high dopant concentration, necessary to reduce the $R_{on}$ of the power stage.

By known art there is then created a type p+ region 4 extending inside the layer 3 and designed to constitute the horizontal isolation region of the control circuit (FIG. 2).

Figure 3:
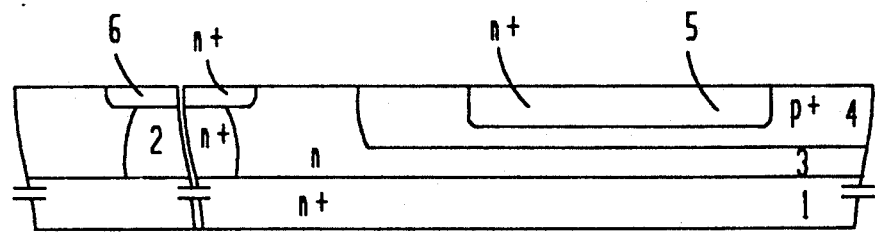
Figure 4:
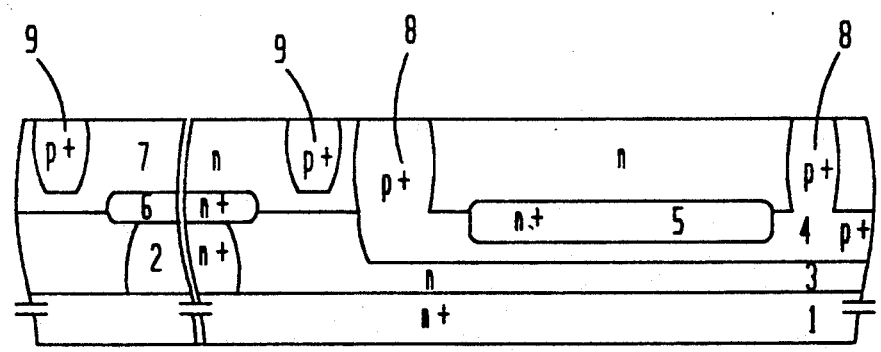

At this point there are provided, by implantation and diffusion processes, two n+ type regions 5 and 6. N+ region 5, a buried collector region, is located in the P+ region 4, and reduces the collector series resistance of the control circuit transistors, and the N+ region 6 also helps to reduce the $R_{on}$ of the power stage. This region forms a second buried drain region with high dopant concentration over the region 2, as illustrated in FIG. 3. Then there is grown a second n type epitaxial layer 7 and subsequently, again by known art, type p+ regions 8, and 9 are provided. The regions 8 are used to isolate the components of the control circuit from each other and from the power stage while the regions 9 define the perimeter of the power stage (FIG. 4). At this point follow, by known techniques, the realisation of the control circuit components (bipolar and/or MOS) and of the power stage components (MOS), and in particular the realisation of the regions 12 (collector sink), 13 (base) and 14 (emitter) of the low voltage npn transistor as well as the realisation of the regions 15 (body) and 16 (source), the deposition of polycrystalline silicon to create the region 17 (gate) and finally opening of the contacts, of which only the source contact 18 is shown in FIG. 5.

In the creation of the body region 15, the body/drain junction 10 (see FIG. 5) of the MOS power transistor must be made to connect with the region 9 described above so as to obtain the structure of FIG. 5.

The process described does not cause any added cost over the process used for the manufacture of a device in accordance with the known art of FIG. 1.

Indeed, it suffices to simply arrange a different layout of the isolation photomasking because the implantation and diffusion are not changed from the standard process nor are other phases added. The length of the termination provided by the region 9 is equal to the sum of the lateral diffusion of the isolation region, its photomasking opening, and the misalignment tolerance, hence less than 20 microns total.

It is noted that, differently from known structures, the structure in accordance with the present invention allows optimization of the operating voltage without changing the power stage $R_{on}$.

It is clear that numerous variants and/or modifications can be made in the process in accordance with the invention without thereby going beyond the scope thereof. For example, the region 2 can be formed using the techniques described in European Patent Application No. 91200853.9 or formation of the region 6 can be omitted if the device is to operate at medium or high voltage as exemplified in FIG. 6.

Extending the basic concept of the present invention the horizontal isolation region 19 can be used in addition to the isolation regions 9 to further increase the junction curvature radius up to values greater than 20–25 microns (see FIG. 7) to allow operation of the device at voltages higher than several hundred volts without recourse to other structures for the termination.

In this case also the added cost of the process is null because it suffices to adjust the horizontal isolation photomasking layout.

Figure 6:
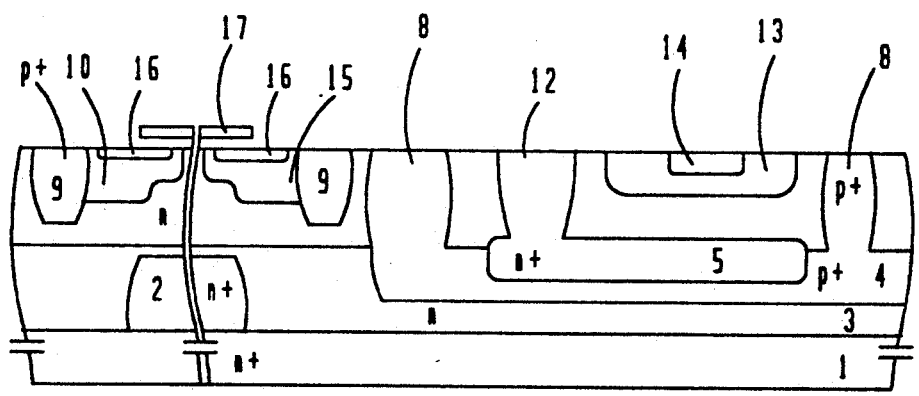
Figure 7:
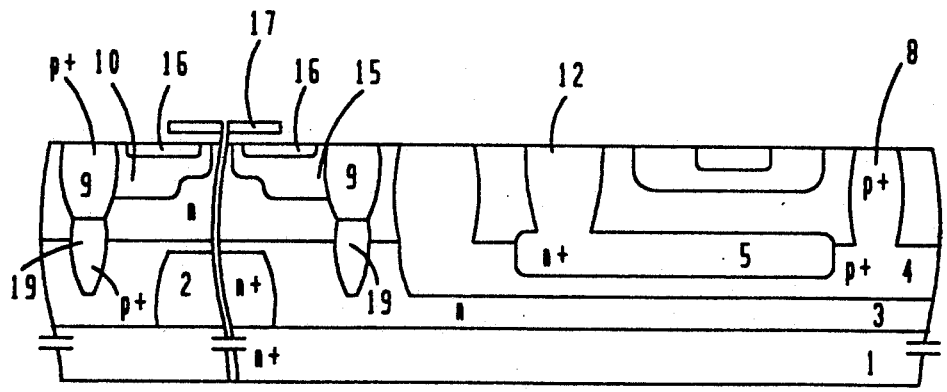

It is noted that the peripheral insulation region 9 of FIGS. 5 and 6 and the isolation regions 9 and 19 of FIG. 7 are to be understood as contour regions of the entire MOS power transistor, which is generally made up of numerous elementary cells.

Therefore only those elementary cells at the edges of the area occupied by the MOS transistor have body regions joining with the isolation region 9; for the sake of simplicity, only the elementary cells at the edge of the MOS transistor are shown in FIGS. 5, 6 and 7.

We claim:

1. An integrated circuit device comprising:
    at least one monolithic body of semiconductor material, including a heavily doped N-type substrate and one or more epitaxial layers thereon, an outermost one of said epitaxial layers extending to a first surface of said monolithic body;
    a power stage and an integrated control circuit, said power stage containing one or more vertical-current-flow MOS transistors;
    said power stage including at least:
        a first patterned diffusion, which is P-type and in proximity to said first surface of said monolithic body;
        a second patterned diffusion, which is P-type, and in proximity to said first surface, and extends deeper into said monolithic body than said first diffusion does;
        a third patterned diffusion, which is heavily doped, and N-type, and extends from said substrate toward said first surface of said monolithic body;
    wherein each said vertical-current-flow MOS transistor comprises
        a respective portion of said first diffusion, which is laterally shaped to define a body portion of said transistor; and
        a source terminal surrounded by said body portion; and
        an n-type drift region to which said body portion forms a p/n junction; and
        an insulated gate which is capacitively coupled to at least a portion of said body portion; and
        a respective portion of said third diffusion, which is laterally shaped to provide a drain portion of said transistor, said drain portion being separated from said body portion by said n-type drift region;
    and wherein at least one said vertical-current-flow MOS transistor further comprises a respective portion of said second diffusion adjoining said body portion thereof;
    and wherein the minimum separation between said second and third diffusions, in any one said MOS transistor, is greater than the minimum separation between said first and third diffusions.

2. The integrated circuit device of claim 1, wherein the breakdown voltage between adjacent portions of said second and third diffusions, in any one said MOS transistor, is greater than the breakdown voltage between adjacent portions of said first and third diffusions.

3. The integrated circuit device of claim 1, wherein said vertical-current-flow MOS transistor comprises multiple adjacent transistor cells connected in parallel, and wherein a respective portion of said second diffusion only adjoins ones of said cells at the periphery of said vertical-current-flow MOS transistor.

4. The integrated circuit device of claim 1, wherein said vertical-current-flow MOS transistor comprises multiple adjacent transistor cells connected in parallel, and wherein a respective portion of said second diffusion laterally surrounds the periphery of said vertical-current-flow MOS transistor, and does not adjoin ones of said cells which are not at the periphery of said vertical-current-flow MOS transistor.

5. The integrated circuit device of claim 1, wherein a respective portion of said second diffusion completely surrounds said power stage laterally.

6. The integrated circuit device of claim 1, wherein said control circuit includes one or more npn bipolar transistors each having an N-type emitter region overlying a p-type base region overlying an n-type collector region overlying a p-type buried isolation region, said p-type buried isolation region being contacted by p-type lateral isolation regions; and wherein said first patterned diffusion also provides a base region for bipolar transistors in said control circuit; and wherein said second patterned diffusion also provides said p-type lateral isolation regions; and wherein said third patterned diffusion also provides said at least part of said collector region of said bipolar transistors.

7. The integrated circuit device of claim 1, wherein said source terminal of said vertical-current-flow MOS transistor is provided by a patterned shallow n+ diffusion which also provides N-type emitter regions of one or more npn bipolar transistors of said control circuit.

8. The integrated circuit device of claim 1, wherein said third diffusion extends upwardly into said outermost epitaxial layer.

9. The integrated circuit device of claim 1, wherein said third diffusion does not extend into said outermost epitaxial layer.

10. The integrated circuit device of claim 1, wherein said second diffusion extends downwardly into, but not through, said outermost epitaxial layer.

11. The integrated circuit device of claim 1, wherein said second diffusion extends downwardly through said outermost epitaxial layer.

12. The integrated circuit device of claim 1, wherein the radius of curvature of said second diffusion is at least 12 microns.

13. The integrated circuit device of claim 1, wherein the curvature radius of said second diffusion is greater than 20 microns.

14. An integrated circuit device comprising:
at least one monolithic body of semiconductor material, including a heavily doped N-type substrate and one or more epitaxial layers thereon, an outermost one of said epitaxial layers being N-type and extending to a first surface of said monolithic body;
a power stage and an integrated control circuit, said power stage containing one or more vertical-current-flow MOS transistors;
said power stage including at least:
  a first patterned diffusion, which is P-type and in proximity to a first surface of said monolithic body;
  a second patterned diffusion, which is P-type, and in proximity to said first surface, and extends deeper into said monolithic body than said first diffusion does, and forms a junction to said epitaxial layer which has less curvature than the junction formed by said first diffusion with said epitaxial layer;
  a third patterned diffusion, which is heavily doped, and N-type, and extends from said substrate toward said first surface of said monolithic body;
  an additional patterned diffusion, which is heavily doped and N-type, and is in proximity to said first surface of said monolithic body, and is shallower than said first diffusion;
wherein each said vertical-current-flow MOS transistor comprises
  a respective portion of said first diffusion, which is laterally shaped to define a body portion of said transistor; and
  a source terminal, comprising a respective portion of said additional diffusion which is surrounded by said body portion; and
  an n-type drift region, comprising a portion of said epitaxial layer, to which said body portion forms a p/n junction; and
  an insulated gate which is capacitively coupled to at least a channel portion of said body portion; and
  a respective portion of said third diffusion, which is laterally shaped to provide a drain portion of said transistor, said drain portion being separated from said body portion by said n-type drift region;
and wherein at least one said vertical-current-flow MOS transistor further comprises a respective portion of said second diffusion adjoining said body portion thereof, such that the minimum separation between said second and third diffusions is greater than the minimum separation between said first and third diffusions.

15. The integrated circuit device of claim 14, wherein the breakdown voltage between adjacent portions of said second and third diffusions, in any one said MOS transistor, is greater than the breakdown voltage between adjacent portions of said first and third diffusions.

16. The integrated circuit device of claim 14, wherein a respective portion of said second diffusion completely surrounds said power stage laterally.

17. The integrated circuit device of claim 14, wherein said control circuit includes one or more npn bipolar transistors each having an N-type emitter region overlying a p-type base region overlying an n-type collector region overlying a p-type buried isolation region, said p-type buried isolation region being contacted by p-type lateral isolation regions; and wherein said first patterned diffusion also provides a base region for bipolar transistors in said control circuit; and wherein said second patterned diffusion also provides said p-type lateral isolation regions; and wherein said third patterned diffusion also provides said at least part of said collector region of said bipolar transistors.

18. The integrated circuit device of claim 14, wherein said third diffusion extends upwardly into said outermost epitaxial layer.

19. The integrated circuit device of claim 14, wherein said third diffusion does not extend into said outermost epitaxial layer.

20. The integrated circuit device of claim 14, wherein said second diffusion extends downwardly into, but not through, said outermost epitaxial layer.

21. The integrated circuit device of claim 14, wherein said second diffusion extends downwardly through said outermost epitaxial layer.

22. An integrated circuit device comprising:
at least one monolithic body of semiconductor material, including a heavily doped N-type substrate and one or more epitaxial layers thereon, an outermost one of said epitaxial layers being N-type and extending to a first surface of said monolithic body;
a power stage and an integrated control circuit, said power stage containing one or more vertical-current-flow MOS transistors, and said control circuit containing one or more npn bipolar transistors;
said power stage including at least;
  a first patterned diffusion, which is P-type and in proximity to a first surface of said monolithic body;

a second patterned diffusion, which is P-type, and in proximity to said first surface, and extends deeper into said monolithic body than said first diffusion does; and a third patterned diffusion, which is heavily doped, and N-type, and extends from said substrate toward said first surface of said monolithic body;

wherein each said vertical-current-flow MOS transistor comprises a respective portion of said first diffusion, which is laterally shaped to define a body portion of said transistor; and a source terminal surrounded by said body portion; and an n-type drift region to which said body portion forms a p/n junction; and an insulated gate which is capacitively coupled to at least a portion of said body portion; and a respective portion of said third diffusion, which is laterally shaped to provide a drain portion of said transistor, said drain portion being separated from said body portion by said n-type drift region;

and wherein at least one said vertical-current-flow MOS transistor further comprises a respective portion of said second diffusion adjoining said body portion thereof;

and wherein multiple ones of said npn bipolar transistors each comprise an N-type emitter region overlying a p-type base region overlying an n-type collector region; and wherein said first patterned diffusion also provides a base region for bipolar transistors in said control circuit; and wherein said second patterned diffusion also provides said p-type lateral isolation regions; and wherein said source terminal of said vertical-current-flow MOS transistor is provided by a patterned shallow n+ diffusion which also provides N-type emitter regions of one or more npn bipolar transistors of said control circuit;

and wherein the minimum separation between said second and third diffusions is greater than the minimum separation between said first and third diffusions.

23. The integrated circuit device of claim 22, wherein the breakdown voltage between adjacent portions of said second and third diffusions, in any one said MOS transistor, is greater than the breakdown voltage between adjacent portions of said first and third diffusions.

24. The integrated circuit device of claim 22, wherein said vertical-current-flow MOS transistor comprises multiple adjacent transistor cells connected in parallel, and wherein a respective portion of said second diffusion only adjoins ones of said cells at the periphery of said vertical-current-flow MOS transistor.

25. The integrated circuit device of claim 22, wherein said vertical-current-flow MOS transistor comprises multiple adjacent transistor cells connected in parallel, and wherein a respective portion of said second diffusion laterally surrounds the periphery of said vertical-current-flow MOS transistor, and does not adjoin ones of said cells which are not at the periphery of said vertical-current-flow MOS transistor.

26. The integrated circuit device of claim 22, wherein multiple ones of said npn bipolar transistors each comprise a p-type buried isolation region under the collector region thereof, said p-type buried isolation region being contacted by p-type lateral isolation regions; and wherein said second patterned diffusion also provides said p-type lateral isolation regions.

27. The integrated circuit device of claim 22, wherein a respective portion of said second diffusion completely surrounds said power stage laterally.

28. The integrated circuit device of claim 22, wherein said source terminal of said vertical-current-flow MOS transistor is provided by a patterned shallow n+ diffusion which also provides N-type emitter regions of one or more npn bipolar transistors of said control circuit.

29. The integrated circuit device of claim 22, wherein said third diffusion extends upwardly into said outermost epitaxial layer.

30. The integrated circuit device of claim 22, wherein said third diffusion does not extend into said outermost epitaxial layer.

31. The integrated circuit device of claim 22, wherein said second diffusion extends downwardly into, but not through, said outermost epitaxial layer.

32. The integrated circuit device of claim 22, wherein said second diffusion extends downwardly through said outermost epitaxial layer.

* * * * *

UNITED STATES PATENT AND TRADEMARK OFFICE
CERTIFICATE OF CORRECTION

PATENT NO. : 5,317,182
DATED : May 31, 1994
INVENTOR(S) : Zambrano et al.

It is certified that error appears in the above-indentified patent and that said Letters Patent is hereby corrected as shown below:

On the title page, item [73] should read as follows:
Assignee: SGS-Thomson Microelectronics S.R.L.
Agrate Brianza, Italy; and Consorzio per la Ricerca sulla Microelettronica
nel Mezzogiorno
Catania CT, Italy.

Signed and Sealed this

Second Day of April, 1996

*Attest:*

BRUCE LEHMAN

*Attesting Officer*  *Commissioner of Patents and Trademarks*